(12) United States Patent
Zhang et al.

(10) Patent No.: US 12,012,653 B2
(45) Date of Patent: Jun. 18, 2024

(54) CLEANING ASSEMBLIES FOR SUBSTRATE PROCESSING CHAMBERS

(71) Applicant: Applied Materials, Inc., Santa Clara, CA (US)

(72) Inventors: Yuxing Zhang, Santa Clara, CA (US); Tuan Anh Nguyen, San Jose, CA (US); Amit Kumar Bansal, Milpitas, CA (US); Nitin Pathak, Mumbai (IN); Saket Rathi, Santa Clara, CA (US); Thomas Rubio, Santa Clara, CA (US); Udit S. Kotagi, Bengaluru (IN); Badri N. Ramamurthi, Los Gatos, CA (US); Dharma Ratnam Srichurnam, Bengaluru (IN)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 17/210,018

(22) Filed: Mar. 23, 2021

(65) Prior Publication Data
US 2022/0307129 A1    Sep. 29, 2022

(51) Int. Cl.
*C23C 16/44*     (2006.01)
*C23C 16/455*    (2006.01)

(52) U.S. Cl.
CPC .... *C23C 16/4405* (2013.01); *C23C 16/45563* (2013.01)

(58) Field of Classification Search
CPC .......... C23C 16/4405; C23C 16/45563; C23C 16/4412; C23C 16/45561; C23C 16/4585
USPC ..................... 118/729; 156/345.54
See application file for complete search history.

(56) References Cited

U.S. PATENT DOCUMENTS

| | | | | |
|---|---|---|---|---|
| 5,746,834 A | * | 5/1998 | Hanley | .................. C30B 25/14 427/248.1 |
| 5,792,272 A | * | 8/1998 | van Os | ................. C23C 16/455 118/723 R |
| 5,849,092 A | * | 12/1998 | Xi | ....................... C23C 16/4405 134/1.1 |
| 5,851,294 A | * | 12/1998 | Young | ................ C23C 16/4558 156/345.33 |

(Continued)

FOREIGN PATENT DOCUMENTS

| | | | |
|---|---|---|---|
| CN | 106098589 A | 11/2016 | |
| KR | 10-2013-0083380 A | 7/2013 | |
| WO | WO-9715698 A1 * | 5/1997 | ............. C23C 16/00 |

OTHER PUBLICATIONS

International Search Report dated Jun. 22, 2022 for Application No. PCT/US2022/019478.

*Primary Examiner* — Jeffrie R Lund
(74) *Attorney, Agent, or Firm* — Patterson + Sheridan, LLP

(57) ABSTRACT

The present disclosure relates to a cleaning assemblies, components thereof, and methods associated therewith for substrate processing chambers. In one example, a cleaning assembly for a substrate processing chamber includes a distribution ring. The distribution ring comprises a body with an inlet and an outlet. The outlet is fluidly coupled to an internal volume of the substrate processing chamber via a sidewall of the substrate processing chamber. The cleaning assembly includes a cleaning conduit configured to fluidly couple a gas manifold to the distribution ring for diverting a first portion of cleaning fluid from the gas manifold to the distribution ring.

17 Claims, 7 Drawing Sheets

(56) References Cited

U.S. PATENT DOCUMENTS

| | | | |
|---|---|---|---|
| 6,019,848 A * | 2/2000 | Frankel | C23C 16/455 |
| | | | 118/715 |
| 6,079,426 A * | 6/2000 | Subrahmanyam | |
| | | | C23C 16/4405 |
| | | | 134/1.1 |
| 6,206,976 B1 * | 3/2001 | Crevasse | H01L 21/68735 |
| | | | 118/728 |
| 6,294,466 B1 * | 9/2001 | Chang | C23C 16/45561 |
| | | | 427/576 |
| 6,347,636 B1 * | 2/2002 | Xia | H01L 21/67017 |
| | | | 134/1.1 |
| 7,482,283 B2 * | 1/2009 | Yamasaki | C23C 16/34 |
| | | | 438/758 |
| 7,780,789 B2 * | 8/2010 | Wu | C23C 16/34 |
| | | | 156/345.33 |
| 10,145,012 B2 * | 12/2018 | Je | C23C 16/52 |
| 10,236,412 B2 * | 3/2019 | Zhu | H01J 37/347 |
| 10,428,426 B2 * | 10/2019 | Raj | C23C 16/50 |
| 11,492,705 B2 * | 11/2022 | Pathak | C23C 16/45565 |
| 2002/0073922 A1 * | 6/2002 | Frankel | C23C 16/4405 |
| | | | 118/715 |
| 2002/0078893 A1 * | 6/2002 | Os | H01J 37/321 |
| | | | 156/345.48 |
| 2003/0106490 A1 * | 6/2003 | Jallepally | C23C 16/45565 |
| | | | 117/89 |
| 2003/0190423 A1 * | 10/2003 | Yang | C23C 16/45544 |
| | | | 427/255.28 |
| 2003/0190497 A1 * | 10/2003 | Yang | C23C 16/45565 |
| | | | 257/E21.171 |
| 2004/0099378 A1 * | 5/2004 | Kim | C23C 16/4558 |
| | | | 156/345.33 |
| 2005/0199184 A1 | 9/2005 | Murugesh et al. | |
| 2006/0075967 A1 * | 4/2006 | Lu | H05B 6/26 |
| | | | 118/723 I |
| 2006/0150913 A1 * | 7/2006 | Wang | H01J 37/321 |
| | | | 118/723 R |
| 2006/0177600 A1 * | 8/2006 | Lu | H01J 37/32688 |
| | | | 427/571 |
| 2006/0196603 A1 * | 9/2006 | Lei | H01J 37/3244 |
| | | | 156/345.33 |
| 2007/0029046 A1 * | 2/2007 | Li | C23C 16/505 |
| | | | 118/723 R |
| 2007/0037397 A1 * | 2/2007 | Lu | H01J 37/321 |
| | | | 438/710 |
| 2009/0165713 A1 * | 7/2009 | Kim | C23C 16/4412 |
| | | | 118/730 |
| 2010/0012273 A1 | 1/2010 | Sankarakrishnan et al. | |
| 2010/0048028 A1 * | 2/2010 | Rasheed | C04B 35/581 |
| | | | 438/758 |
| 2011/0171758 A1 * | 7/2011 | Su | H01L 21/02579 |
| | | | 257/E21.04 |
| 2013/0098455 A1 * | 4/2013 | Ng | C23C 16/303 |
| | | | 137/561 R |
| 2013/0285065 A1 * | 10/2013 | Zhu | H01L 21/02661 |
| | | | 204/192.25 |
| 2016/0064219 A1 * | 3/2016 | Yamamoto | H01J 37/32724 |
| | | | 118/725 |
| 2016/0153085 A1 * | 6/2016 | Ueda | C23C 16/4408 |
| | | | 118/730 |
| 2017/0306493 A1 * | 10/2017 | Raj | H01J 37/32449 |
| 2020/0216952 A1 | 7/2020 | Ghosh et al. | |
| 2021/0002763 A1 | 1/2021 | Pathak et al. | |
| 2021/0305020 A1 * | 9/2021 | Subramani | H01J 37/32082 |
| 2022/0307129 A1 * | 9/2022 | Zhang | C23C 16/45561 |
| 2022/0307135 A1 * | 9/2022 | Pathak | C23C 16/4585 |

\* cited by examiner

CLEANING ASSEMBLIES FOR SUBSTRATE PROCESSING CHAMBERS

BACKGROUND

Field

Aspects of the present disclosure relate generally to cleaning assemblies, components thereof, and methods associated therewith for substrate processing chambers.

Description of the Related Art

Substrate processing chambers sometimes need to be cleaned after substrate processing operations, such as chemical vapor deposition (CVD) operations. Cleaning removes residues, which can have harmful effects on equipment and operations, from surfaces inside the chamber. Sometimes cleaning is plasma-based in which a reactive gas (e.g., a halogen-containing gas) is used to generate cleaning radicals. For example, fluorine-containing reactive gases such as $NF_3$ may be used. Sometimes cleaning radicals are generated in situ. However, RF plasma cleaning sometimes damages a portion of the chamber such as the faceplate, which can create aluminum defects in the substrate. Cleaning radicals may also be generated ex situ using a remote plasma source (RPS). However, flow of RPS cleaning fluid is introduced entirely at the top and center of the chamber and directed primarily through a center region of the chamber before being removed along the edge, resulting in non-uniform cleaning.

Therefore, there is a need for improved cleaning of substrate processing chambers.

SUMMARY

Implementations of the present disclosure generally relate to cleaning assemblies for substrate processing chambers.

In one example, a cleaning assembly for a substrate processing chamber includes a distribution ring. The distribution ring comprises a body with an inlet and an outlet. The outlet is fluidly coupled to an internal volume of the substrate processing chamber via a sidewall of the substrate processing chamber. The cleaning assembly includes a cleaning conduit configured to fluidly couple a gas manifold to the distribution ring for diverting a first portion of cleaning fluid from the gas manifold to the distribution ring.

In one example, a substrate processing assembly includes a chamber body and a lid defining an internal volume, a faceplate disposed in the internal volume, and a cleaning assembly. The cleaning assembly includes a manifold and a distribution ring. The manifold includes an inlet configured to fluidly couple to a cleaning fluid source, a first outlet fluidly coupled to the internal volume above the faceplate, and a second outlet. The distribution ring has an inlet fluidly coupled to the second outlet of the manifold and an outlet fluidly coupled to the internal volume via one or more openings in a sidewall of the chamber body below the faceplate.

In one example, a substrate processing system includes a chamber defining an internal volume, a faceplate disposed in the internal volume, a pedestal disposed in the chamber, and a cleaning assembly. The cleaning assembly includes a cleaning fluid source, a distribution ring having an inlet fluidly coupled to the cleaning fluid source and an outlet fluidly coupled to the internal volume via one or more openings in a sidewall of the chamber, and an isolation valve fluidly coupled between the cleaning fluid source and the distribution ring. The system includes a non-transitory computer readable medium storing instructions for a cleaning process, that, when executed by a processor of the system, cause the system to sequentially position the pedestal in a first vertical position, direct cleaning fluid to the internal volume entirely above the faceplate, and open the isolation valve to divert a first portion of the cleaning fluid to the internal volume below the faceplate.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1A:
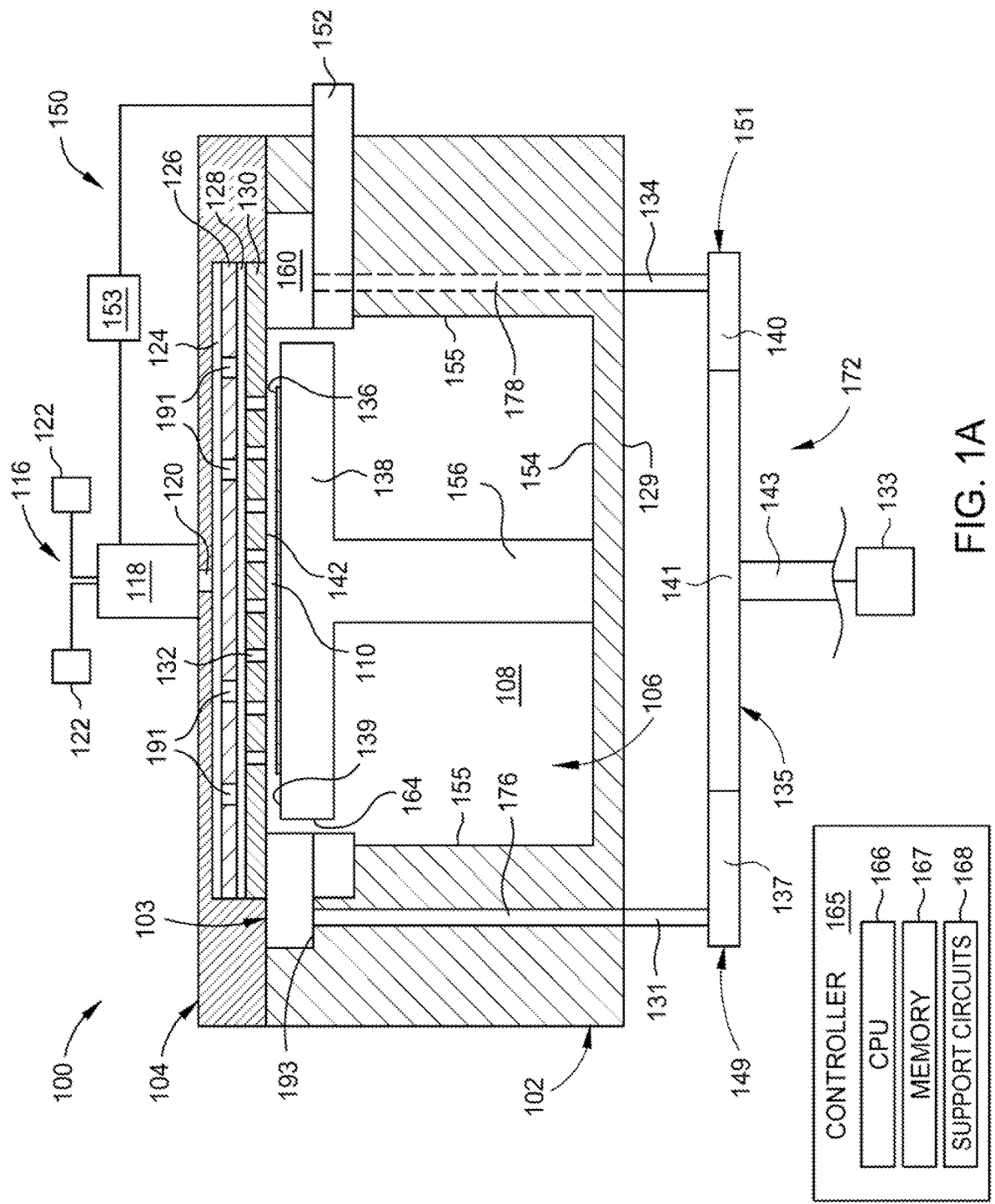
FIG. 1A is a schematic cross-sectional view of a substrate processing chamber, according to one implementation.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

The present disclosure relates to cleaning assemblies, components thereof, and methods associated therewith for substrate processing chambers.

Apparatus and/or methods of the present disclosure provide improved cleaning of substrate processing chambers, particularly along the bottom and edge thereof. In addition, apparatus and/or methods disclosed herein reduce cleaning time and increase throughput.

Cleaning assemblies disclosed herein are capable of introducing at least a portion of a flow of cleaning fluid, such as a remote plasma source (RPS)-generated cleaning fluid, proximate a bottom and edge of a chamber and directing this portion primarily along bottom and edge regions of the chamber before being removed. Cleaning assemblies disclosed herein are capable of increasing the flow of cleaning radicals below a faceplate such as in the vicinity of a bottom neck, pedestal edge, chamber sidewall, pumping ring and faceplate edge, in contrast to conventional approaches in which cleaning radicals are substantially consumed in a center region before reaching the bottom and edge of the chamber. Cleaning assemblies disclosed herein are capable of reducing cleaning times and increasing throughput, compared to conventional approaches which instead require additional cleaning time to improve cleaning along the bottom and edge. Cleaning assemblies disclosed herein are capable of high conductance and uniform distribution of the cleaning fluid, in contrast to conventional approaches in which cleaning fluid flow is low-flow and non-uniform.

FIG. 1A is a schematic cross-sectional view of a substrate processing chamber 100, according to one implementation. The substrate processing chamber 100 may be, for example, a chemical vapor deposition (CVD) chamber or a plasma enhanced CVD chamber. The substrate processing chamber 100 has a chamber body 102 and a chamber lid 104. The chamber body 102 includes an internal volume 106 therein. The internal volume 106 is the space defined by the chamber body 102 and the chamber lid 104.

The substrate processing chamber 100 includes a gas distribution assembly 116 coupled to or disposed in the chamber lid 104 to deliver a flow of one or more gases into a processing region 110. The gas distribution assembly 116 includes a gas manifold 118 coupled to a gas inlet passage 120 formed in the chamber lid 104. The gas manifold 118 receives a flow of gases from one or more gas sources 122 (two are shown). One or more of the gas sources 122 may include a source of cleaning fluid such as a remote plasma source (RPS). During a cleaning process, the RPS may generate cleaning radicals using a reactive gas (e.g., a halogen-containing gas or oxygen-containing gas, among others). For example, fluorine-containing reactive gases such as $NF_3$ may be used to generate a flow of cleaning fluid containing fluorine radicals. Alternatively, oxygen gas (e.g., 02) may be used to generate a flow of cleaning fluid containing oxygen radicals. The flow of gases received from the one or more gas sources 122 distributes across a gas box 124, flows through a plurality of openings 191 of a backing plate 126, and further distributes across a plenum 128 defined by the backing plate 126 and a faceplate 130. The faceplate 130 is disposed in the internal volume 106 between the plenum 128 and the processing region 110. The flow of gases then flows into the processing region 110 of the internal volume 106 through a plurality of openings 132 of the faceplate 130. The gases enter the processing region 110 through a lower surface 142 of the faceplate 130 which faces the processing region 110.

The internal volume 106 includes a pedestal 138 disposed in the chamber body 102. The pedestal 138 supports a substrate 136 within the substrate processing chamber 100. The pedestal 138 supports the substrate 136 on a support surface 139 of the pedestal 138. The pedestal 138 has a bottom neck 156. The pedestal 138 includes a heater and an electrode disposed therein (not shown). The electrode may supply alternating current (AC), direct current (DC) voltage, or radio frequency (RF) energy to the internal volume 106 and/or the processing region 110.

The pedestal 138 is movably disposed in the internal volume 106 by a lift system (not shown). Movement of the pedestal 138 facilitates transfer of the substrate 136 to and from the internal volume 106 through a slit valve (not shown) formed through the chamber body 102. The pedestal 138 may also be moved to different processing positions for processing of the substrate 136.

During substrate processing, as gases flow through the plurality of openings 132 and into the processing region 110, a heater heats the pedestal 138 and the support surface 139. Also during substrate processing, the electrode in the pedestal 138 propagates the alternating current (AC), direct current (DC) voltage, or radio frequency (RF) energy to facilitate plasma generation in the processing region 110 and/or to facilitate chucking of the substrate 136 to the pedestal 138. The gases in the processing region 110, heating of the pedestal 138, and energy from the electrode in the pedestal 138 facilitate deposition of a film onto the substrate 136 during substrate processing. The faceplate 130 (which is grounded via coupling to the chamber body 102) and the electrode of the pedestal 138 facilitate formation of a capacitive plasma coupling. When power is supplied to the electrode in the pedestal 138, an electric field is generated between the faceplate 130 and pedestal 138 such that atoms of gases present in the processing region 110 between the pedestal 138 and the faceplate 130 are ionized and release electrons. The ionized atoms accelerate to the pedestal 138 to facilitate film formation on the substrate 136.

A pumping device 103 is disposed in the substrate processing chamber 100. The pumping device 103 facilitates removal of gases from the internal volume 106 and processing region 110. The gases exhausted by the pumping device 103 include one or more of a processing gas, a processing residue, a cleaning gas, a cleaning residue, and/or a purge gas. The processing residue may result from the process of depositing a film onto the substrate 136.

The pumping device 103 includes a pumping ring 160 disposed on a stepped surface 193 of the chamber body 102. The stepped surface 193 is stepped upwards from a bottom surface 154 of the chamber body 102. The stepped surface 193 supports the pumping ring 160. The pumping ring 160 includes a body 107 (shown in FIG. 1B). The body 107 of the pumping ring 160 is made from material including one or more of aluminum, aluminum oxide, and/or aluminum nitride. The pumping ring 160 is fluidly coupled to a foreline 172 through a first conduit 176 and a second conduit 178. The foreline 172 includes a first vertical conduit 131, a second vertical conduit 134, a horizontal conduit 135, and an exit conduit 143. The exit conduit 143 in one example is a third vertical conduit. In one example, the first conduit 176 and the second conduit 178 are openings formed in the chamber body 102 and extend from the stepped surface 193 to a lower outer surface 129 of the chamber body 102. Alternatively, the first conduit 176 and the second conduit 178 may be tubes or other flow devices that extend between a surface of the chamber body 102, such as the bottom surface 154, and the pumping ring 160. As an example, the first conduit 176 and the second conduit 178 may be part of the first vertical conduit 131 and the second vertical conduit 134, respectively. In such an example, the first vertical conduit 131 and the second vertical conduit 134 may extend through the chamber body 102 and be coupled to the pumping ring 160.

The first conduit 176 is fluidly coupled to the pumping ring 160 at a first end and the first vertical conduit 131 of the foreline 172 at a second end. The second conduit 178 is fluidly coupled to the pumping ring 160 at a first end and the second vertical conduit 134 of the foreline 172 at a second end. The first vertical conduit 131 and the second vertical conduit 134 are fluidly coupled to the horizontal conduit 135. The horizontal conduit 135 includes a first portion 137 coupled to the first vertical conduit 131, a second portion 140 coupled to the second vertical conduit 134, and a third portion 141 coupled to the exit conduit 143. The horizontal conduit 135 includes a first end 149 adjacent to the first vertical conduit 131 and a second end 151 adjacent to the second vertical conduit 134. The horizontal conduit 135 may be made up of a single body or fabricated from two or more components.

The first conduit 176, second conduit 178, first vertical conduit 131, second vertical conduit 134, and horizontal conduit 135 are configured to direct gases therethrough. The first conduit 176, second conduit 178, first vertical conduit 131 and second vertical conduit 134 need not be completely vertical and may be angled or may include one or more bends and/or angles. The horizontal conduit 135 need not be completely horizontal and may be angled or may include one or more bends and/or angles.

In one embodiment, which can be combined with other embodiments, the pumping ring 160 is disposed inside of the chamber body 102 while the first vertical conduit 131, the second vertical conduit 134, the horizontal conduit 135, and the exit conduit 143 are disposed or extend outside of the chamber body 102. In such an embodiment, the first conduit 176 and the second conduit 178 are disposed through the chamber body 102.

The exit conduit 143 is fluidly coupled to a vacuum pump 133 to control the pressure within the processing region 110 and to exhaust gases and residue from the processing region 110. The vacuum pump 133 exhausts gases from the processing region 110 through the pumping ring 160, the first conduit 176, the second conduit 178, the first vertical conduit 131, the second vertical conduit 134, the horizontal conduit 135, and the exit conduit 143 of the foreline 172.

A cleaning assembly 150 is coupled to the substrate processing chamber 100. The manifold 118 and/or one or more gas sources 122 may form part of the cleaning assembly 150. The cleaning assembly 150 diverts at least a portion of a flow of cleaning fluid from the manifold 118 to a sidewall 155 of the chamber body 102. The cleaning assembly 150 generally includes a distribution ring 152 for introducing the cleaning fluid to the internal volume 106 through the sidewall 155 of the chamber body 102 and an isolation valve 153 regulating flow of cleaning fluid from the manifold 118 to the distribution ring 152. The distribution ring 152 is disposed in the chamber body 102 adjacent to and/or below the pumping ring 160. The flow of cleaning fluid exiting the distribution ring 152 may be directed primarily through a lower portion 108 of the internal volume 106 including along the bottom surface 154 and the sidewall 155 of the chamber body 102 before being exhausted through the pumping ring 160. The lower portion 108 of the internal volume 106 may refer to a region defined vertically between the bottom surface 154 and the pumping ring 160 and defined laterally between opposing sidewalls 155 of the chamber body 102. The cleaning fluid and radicals contained in the lower portion 108 of the internal volume 106 may contact and clean surfaces inside the substrate processing chamber 100 located below the faceplate 130 such as the bottom neck 156 of the pedestal 138, pedestal edge 164, chamber sidewall 155, and pumping ring 160.

In one embodiment (not shown), which can be combined with other embodiments, the cleaning fluid may contact and clean an edge of the faceplate 130. For example, processing residue may accumulate along an outer edge region of the lower surface 142 of the faceplate 130 located proximate an interface between the faceplate 130 and an inner radial wall of at least one of the pumping ring or insulator ring as described in more detail below. In such examples, upward flow of cleaning fluid from the lower portion 108 of the internal volume 106 to the pumping ring 160 may facilitate cleaning of the faceplate edge, unlike conventional approaches in which cleaning flow does not contact the faceplate edge. The cleaning assembly 150 is described in more detail below with regard to FIG. 1B.

A controller 165, such as a programmable computer, is connected to the substrate processing chamber 100 and the cleaning assembly 150. For example, the controller 165 may be connected to the lift system of the pedestal 138 for directing movement of the pedestal 138 to different processing positions as shown in FIGS. 2A-2D. The controller 165 may be connected to the isolation valve 153 for opening and closing the isolation valve 153 to regulate flow of cleaning fluid from the manifold 118 to the distribution ring 152. The controller 165 may be connected to various other components of the substrate processing chamber 100 and the cleaning assembly 150.

The controller 165 includes a programmable central processing unit (CPU) 166, which is operable with a memory 167 (e.g., non-volatile memory) and support circuits 168. The support circuits 168 are conventionally coupled to the CPU 166 and comprise cache, clock circuits, input/output subsystems, power supplies, and the like, and combinations thereof coupled to the various components of the substrate processing chamber 100 and the cleaning assembly 150.

In some embodiments, the CPU 166 is one of any form of general purpose computer processor used in an industrial setting, such as a programmable logic controller (PLC), for controlling various monitoring system component and subprocessors. The memory 167, coupled to the CPU 166, is non-transitory and is typically one or more of readily available memory such as random access memory (RAM), read only memory (ROM), floppy disk drive, hard disk, or any other form of digital storage, local or remote.

Herein, the memory 167 is in the form of a computer-readable storage media containing instructions (e.g., non-volatile memory), that when executed by the CPU 166, facilitates the operation of the substrate processing chamber 100 and the cleaning assembly 150. The instructions in the memory 167 are in the form of a program product such as a program that implements the methods of the present disclosure (e.g., middleware application, equipment software application etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1B:
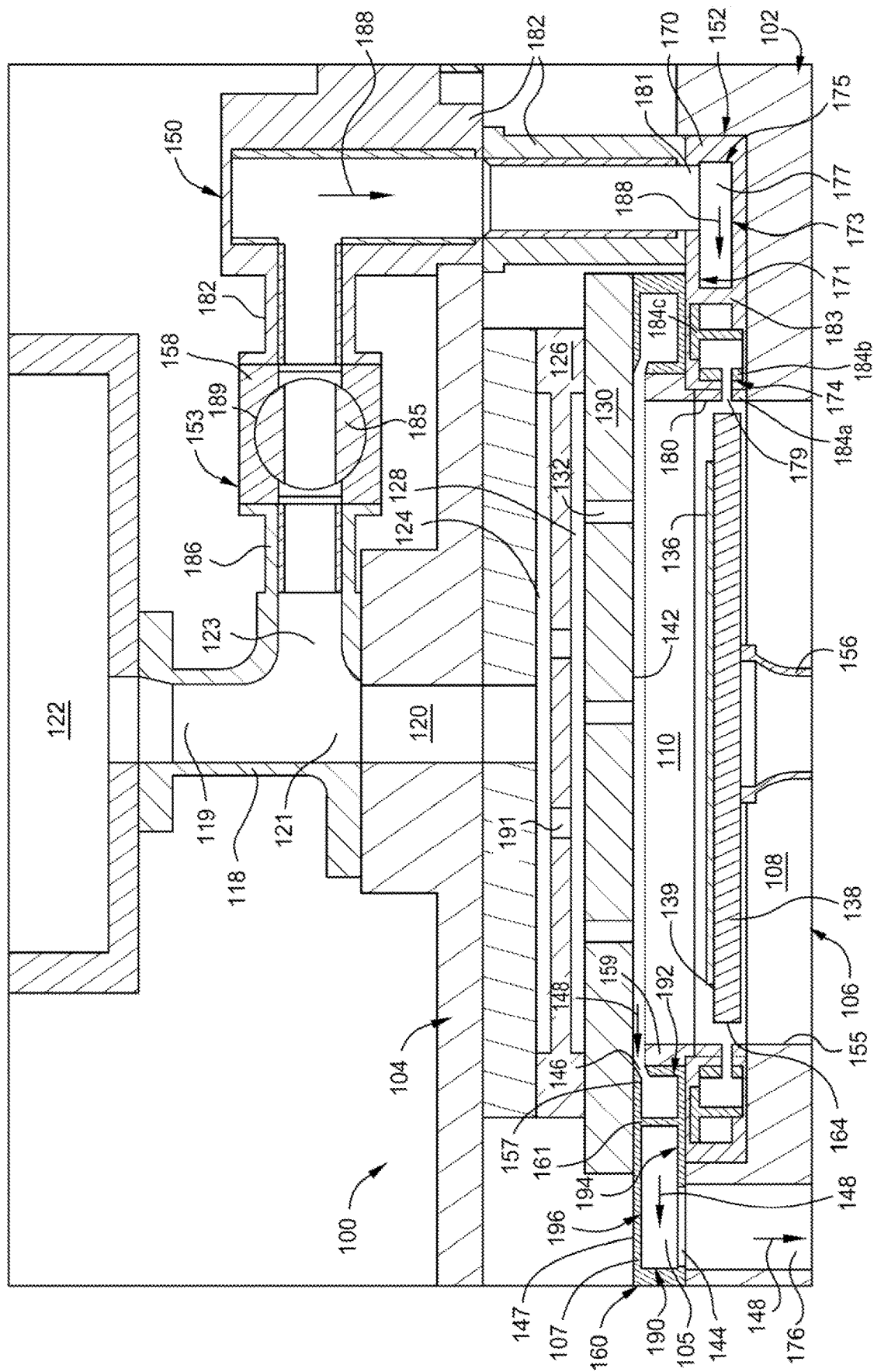
FIG. 1B is a cross-sectional partial view of the substrate processing chamber illustrated in FIG. 1A, according to one implementation.

FIG. 1B is a cross-sectional partial view of the substrate processing chamber 100 illustrated in FIG. 1A, according to one implementation. The pumping ring 160 is disposed around the pedestal 138. The support surface 139 is configured to support a substrate 136 thereon. The body 107 of the pumping ring 160 includes an upper wall 196, a lower wall 194, an inner radial wall 192, and an outer radial wall 190. An annulus 105 of the pumping ring 160 is defined by the upper wall 196, lower wall 194, inner radial wall 192, and outer radial wall 190. The pumping ring 160 includes a curved portion 157 adjacent to the inner radial wall 192 and the upper wall 196. The pumping ring 160 may be formed of a single body, or may be formed of multiple components. An optional insulator ring 159 is disposed between the pumping ring 160 and the pedestal 138.

The pumping ring 160 includes one or more openings 146 in the curved portion 157 of the body 107. The one or more openings 146 are configured to direct fluid 148, such as processing gases, processing residue, cleaning gases, cleaning residue, and/or purge gases from the processing region 110 and the internal volume 106 into the annulus 105. The one or more openings 146 are illustrated in FIG. 1B as angled and directed downward and radially outward relative to the processing region 110 and/or the pedestal 138. The one or more openings 146 extend from a top surface 147 and through the curved portion 157 of the body 107. The one or more openings 146 can be linear or angled, and can be disposed vertically or horizontally. The one or more openings 146 can be disposed anywhere in the top surface 147 of the pumping ring 160. The location(s), size(s), shape(s), and/or depth(s) of the one or more openings 146 can be modified based on process requirements, cleaning requirements, and/or exhaust requirements. The angled orientation of the one or more openings 146 illustrated in FIG. 1B facilitates uniform deposition of film onto substrate 136, uniform cleaning, and uniform exhaustion of fluid 148. As an example, the angled orientation of the one or more openings 146 can elongate the depth of the one or more openings 146, tune backpressure, and provide additional expansion volume for fluid 148. The angled orientation can also reduce or eliminate the buildup of pressure gradients and/or velocity gradients for the fluid 148 in the pumping ring 160, thereby facilitating uniform exhaustion of fluid 148, uniform deposition onto substrate 136, and uniform cleaning.

The pumping ring 160 includes a first exhaust port 144 and a second exhaust port (not shown) in the body 107. The first exhaust port 144 and the second exhaust port are disposed radially outside of the support surface 139 of the pedestal 138. The first exhaust port 144 and the second exhaust port are fluidly coupled to the annulus 105. The first exhaust port 144 is fluidly coupled to the first vertical conduit 131 through the first conduit 176 (shown in FIG. 1A). The first exhaust port 144 is configured to direct fluid 148 from the annulus 105 and into the first conduit 176. The second exhaust port is fluidly coupled to the second vertical conduit 134 through the second conduit 178 (shown in FIG. 1A). The second exhaust port is configured to direct fluid 148 from the annulus 105 and into the second conduit 178. The first exhaust port 144 and the second exhaust port are disposed on opposite sides of the pumping ring 160.

The pumping ring 160 includes a first baffle 161 adjacent to and radially inward of the first exhaust port 144. The pumping ring 160 also includes a second baffle (not shown) adjacent to and radially inward of the second exhaust port. The first baffle 161 and the second baffle are disposed in the annulus 105. The first baffle 161 is disposed between the first exhaust port 144 and the inner radial wall 192 of the pumping ring 160. The second baffle is disposed between the second exhaust port and the inner radial wall 192 of the pumping ring 160. In one embodiment, which can be combined with other embodiments, the first baffle 161 and the second baffle are coupled to the upper wall 196 and the lower wall 194 of the pumping ring 160. The first baffle 161 and the second baffle may be formed as a single body with the body 107 of the pumping ring 160.

The distribution ring 152 is disposed around the pedestal 138 and located below the pumping ring 160. A body 170 of the distribution ring 152 includes an upper wall 171, a lower wall 173, an inner radial wall 174, and an outer radial wall 175. An annulus 177 of the distribution ring 152 is defined by the upper wall 171, lower wall 173, inner radial wall 174, and outer radial wall 175. The distribution ring 152 may be formed of a single body, or may be formed of multiple components. The body 170 of the distribution ring 152 may be made from material including one or more of aluminum, aluminum oxide, and/or aluminum nitride.

The distribution ring 152 includes one or more openings 179 in the inner radial wall 174 of the body 170. The one or more openings 179 are configured to direct a cleaning fluid 188 from the annulus 177 to the lower portion 108 of the internal volume 106. The one or more openings 179 are illustrated in FIG. 1B as aligned radially relative to the chamber body 102 and/or the pedestal 138. The one or more openings 179 extend from the annulus 177 through the inner radial wall 174 of the body 107 to an inner surface 180 of the distribution ring 152. The one or more openings 179 can be linear or angled, and can be disposed vertically, horizontally or diagonally. The one or more openings 179 can be disposed anywhere in the inner radial wall 174 of the distribution ring 152. The location(s), size(s), shape(s), and/or depth(s) of the one or more openings 179 can be modified based on cleaning requirements. The radial orientation of the one or more openings 179 illustrated in FIG. 1B facilitates uniform distribution of the cleaning fluid 188 into the lower portion 108 of the internal volume 106. As an example, the radial orientation of the one or more openings 179 can help with uniform distribution of the cleaning fluid 188 largely independent of the vertical position of the pedestal 138.

The distribution ring 152 includes an inlet port 181 in the body 107. The inlet port 181 is disposed radially outside of the chamber body 102 for coupling to an outlet of a first cleaning conduit 182. The inlet port 181 is fluidly coupled to the annulus 177. The inlet port 181 is fluidly coupled to the isolation valve 153 through the first cleaning conduit 182. The inlet port 181 is configured to direct cleaning fluid 188 from the first cleaning conduit 182 and into the annulus 177.

The distribution ring 152 includes a baffle 183 adjacent to and radially inward of the inlet port 181 for helping to more uniformly distribute flow of the cleaning fluid 188 from the inlet port 181 to the one or more openings 179. The baffle 183 is disposed in the annulus 177. The baffle 183 is disposed between the inlet port 181 and the inner radial wall 174 of the distribution ring 152. In one embodiment, which can be combined with other embodiments, the baffle 183 is coupled to the upper wall 171 and the lower wall 173 of the distribution ring 152. The baffle 183 may be made from quartz. In one example, the baffle 183 may be formed as a single body with the body 170 of the distribution ring 152 and/or made from material including one or more of aluminum, aluminum oxide, and/or aluminum nitride. Alternatively, the baffle 183 may be separate from the body 170. The baffle 183 may be formed from one or multiple pieces.

The distribution ring 152 includes one or more liners, such as liners 184a, 184b, and 184c to reduce consumption of cleaning radicals on internal surfaces of the body 170. The one or more liners 184a-c may comprise quartz, for example to reduce consumption of oxygen radicals contained in the cleaning fluid 188.

An inlet of the first cleaning conduit 182 is coupled to the isolation valve 153. Although the first cleaning conduit 182 shown in FIG. 1B includes multiple pieces coupled together, the first cleaning conduit 182 may be formed of only a single piece. The isolation valve 153 includes a valve body 158 having a valve seat 189 with a seal, such as an o-ring seal (not shown), a valve element such as ball 185 for sealing with the valve seat, and an actuator (not shown) for moving the valve element between open and closed positions. Although not shown, a cooling plate may be attached to the valve body 158 to help lower the temperature of one or more heat sensitive components of the isolation valve 153, such as the o-ring seal, during exposure to hot gases. Although a ball valve is shown in the illustrated embodiments, the isolation valve 153 may be any type of isolation valve, such as a gate valve, plug valve or flapper valve, among others.

The isolation valve 153 is coupled to the manifold 118, for example via a second cleaning conduit 186. As shown in FIG. 1B, the manifold 118 includes an inlet 119 fluidly coupled to the cleaning fluid source 122, a first outlet 121 fluidly coupled to the internal volume 106 via the lid 104 of the substrate processing chamber 100, and a second outlet 123 fluidly coupled to the isolation valve 153 via the second cleaning conduit 186. Therefore, the first outlet 121 is fluidly coupled to the internal volume 106 above the faceplate 130, whereas the second outlet 123 is fluidly coupled to the internal volume 106 below the faceplate 130. Although the second cleaning conduit 186 shown is integral with the manifold 118, the manifold 118 and second cleaning conduit 186 may be separate pieces which are coupled together. Although not illustrated, internal surfaces of one or more of the isolation valve 153, the first cleaning conduit 182 and the second cleaning conduit 186 may be covered with one or more liners, such as quartz liners, to reduce consumption of cleaning radicals thereon. An inner diameter of the first and second cleaning conduits 182, 186 may be about 1 inch to about 2 inches, such as about 1.5 inches. Although the first and second cleaning conduits 182, 186 are shown as being external to the chamber body 102 and the chamber lid 104, one or both of the first and second cleaning conduits 182, 186 or portions thereof may be integrated into and/or routed through one or both of the chamber body 102 and chamber lid 104. It is also contemplated that one or both of the first and second cleaning conduits 182, 186 may be optional and the isolation valve 153 may instead be coupled directly to one or both of the manifold 118 or the distribution ring 152.

The isolation valve 153 is operable to regulate flow of cleaning fluid 188 from the manifold 118 to the distribution ring 152. For example, the isolation valve 153 may be closed to shut off flow to the distribution ring 152 during one or more non-cleaning processes of the substrate processing chamber 100, such as during a deposition process. Although the isolation valve 153 shown in the illustrated embodiments is an on/off valve, a control valve may be used in place of or in addition to the isolation valve 153 to actively control flow of cleaning fluid 188 through the valve. Before or after a cleaning process is performed, internal surfaces of the cleaning assembly 150, including the one or more liners 184a-c, may be purged with one or more purge gases to help maintain the integrity of the internal surfaces and/or to improve resistance of the internal surfaces, such as the one or more liners, to damage induced by cleaning gases, for example.

During cleaning, the isolation valve 153 is opened to divert at least a portion of the cleaning fluid 188 to the lower portion 108 of the internal volume 106. The diverted portion of the cleaning fluid 188 is diverted from the manifold 118 through the second cleaning conduit 186, the isolation valve 153, the first cleaning conduit 182 and the distribution ring 152 before entering the lower portion 108 of the internal volume 106 through the sidewall 155 of the chamber body 102. The remaining cleaning fluid 188 is introduced to the processing region 110 of the internal volume 106 through the gas inlet passage 120 formed in the chamber lid 104, the plurality of openings 191 of the backing plate 126, and the plurality of openings 132 of the faceplate 130. The diverted portion of the cleaning fluid 188 may be about 40% to about 60% of the total flow of cleaning fluid 188, such as about 50% of the total flow. The diverted portion may be dependent on the hardware design of the cleaning assembly 150, such as the internal sizing of the components thereof. However, use of a control valve in place of or in addition to the isolation valve 153 may enable active control of the diverted portion. A total time for a cleaning process using the cleaning assembly 150 may be about 200 seconds or less, such as about 100 seconds to about 200 seconds, such as about 200 seconds.

As described above, the diverted portion of the cleaning fluid 188 is introduced to the lower portion 108 of the internal volume 106 so that the diverted portion is able to contact and clean one or more of the bottom neck 156, pedestal edge 164, chamber sidewall 155 and pumping ring 160. Using apparatus and/or methods disclosed herein, cleaning of the lower portion 108 of the internal volume 106 may be controlled based on the opening and closing of the isolation valve 153, including the timing thereof, and the vertical position of the pedestal 138.

Figure 2A:
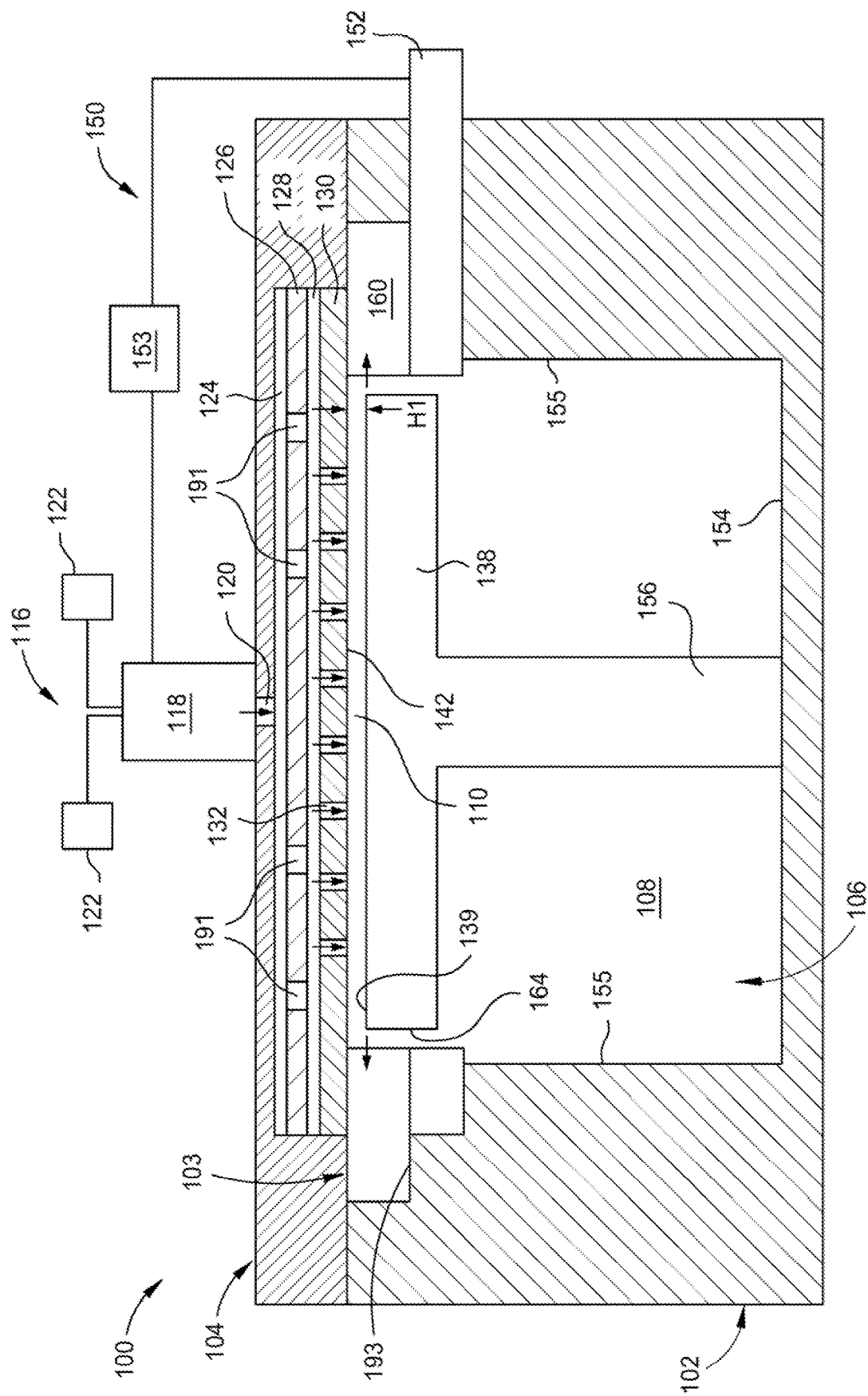
FIGS. 2A-2D are schematic cross-sectional partial views of the substrate processing chamber of FIG. 1A showing the pedestal in different vertical positions during cleaning.

FIGS. 2A-2D are schematic cross-sectional partial views of the substrate processing chamber 100 of FIG. 1A showing the pedestal 138 in different vertical positions during cleaning. FIG. 2A for example shows the pedestal 138 in an upper position with a first vertical spacing, or height H1, measured between the lower surface 142 of the faceplate 130 and the support surface 139 of the pedestal 138 of about 0.25 inches or less, such as about 0.125 inches to about 0.25 inches, such as about 0.21 inches. With the pedestal 138 in the upper position, the isolation valve 153 may be closed so that the entire flow of cleaning fluid 188 is introduced to the internal volume 106 above the faceplate 130 resulting in cleaning predominantly of the faceplate 130.

Figure 2B:
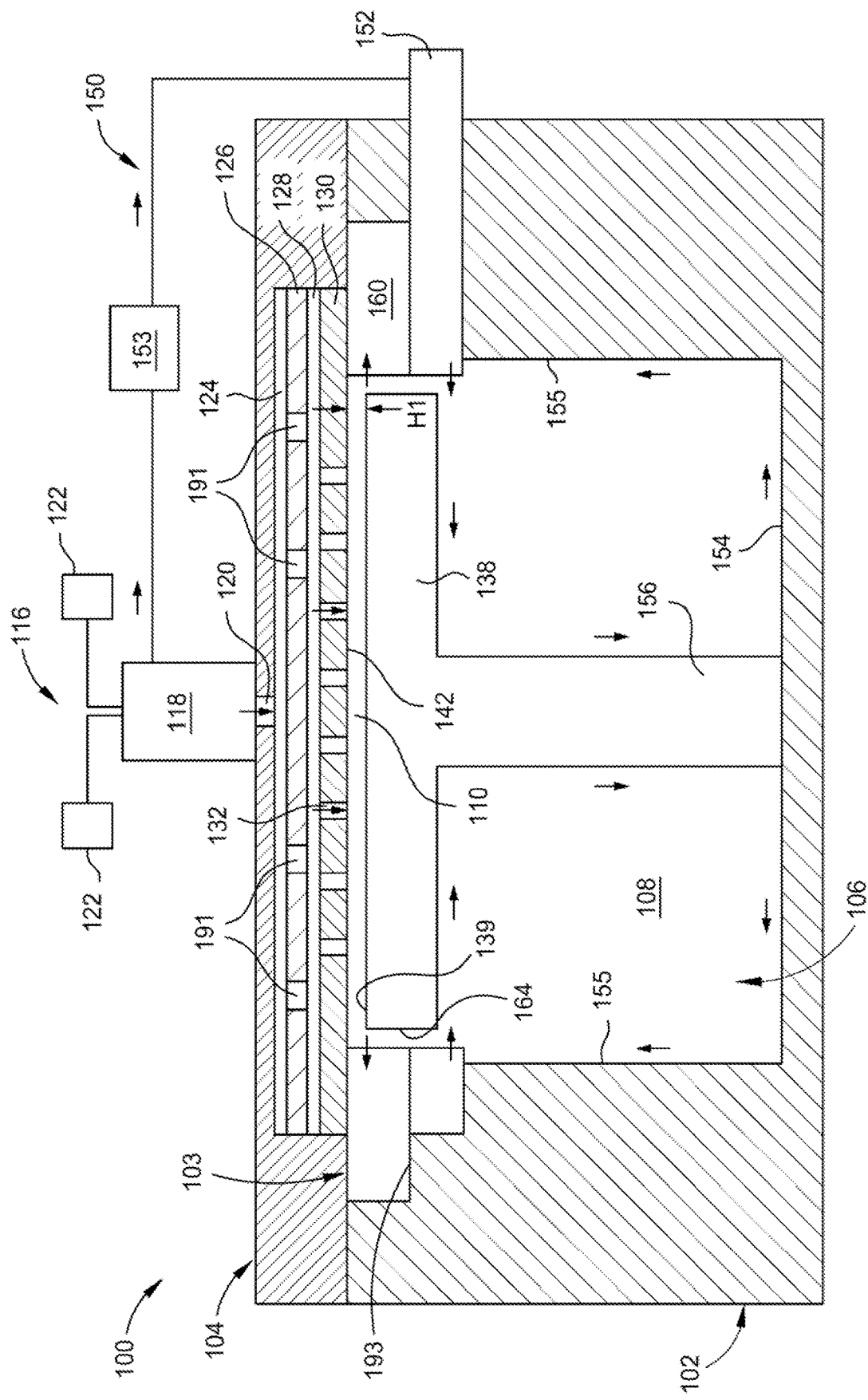

FIG. 2B shows the pedestal 138 in the upper position with the isolation valve 153 opened so that a portion of the flow of cleaning fluid 188 is diverted away from the faceplate 130 to the distribution plate 152. Positioning the pedestal 138 in the upper position with the isolation valve 153 opened diverts a first portion of the cleaning fluid 188 directly to the internal volume 106 below the faceplate 130, such as directly to the lower portion 108. Diverting the first portion of the cleaning fluid 188 as shown in FIG. 2B results in cleaning predominantly of the sidewall 155, bottom surface 154 and bottom neck 156. Because the gas inlet passage 120 in the chamber lid 104 is always open, a second portion of the cleaning fluid 188 continues to be introduced to the internal volume 106 above the faceplate 130. Therefore, with the isolation valve 153 opened, the first and second portions of cleaning fluid 188 are introduced to the internal volume 106 simultaneously.

Figure 2C:
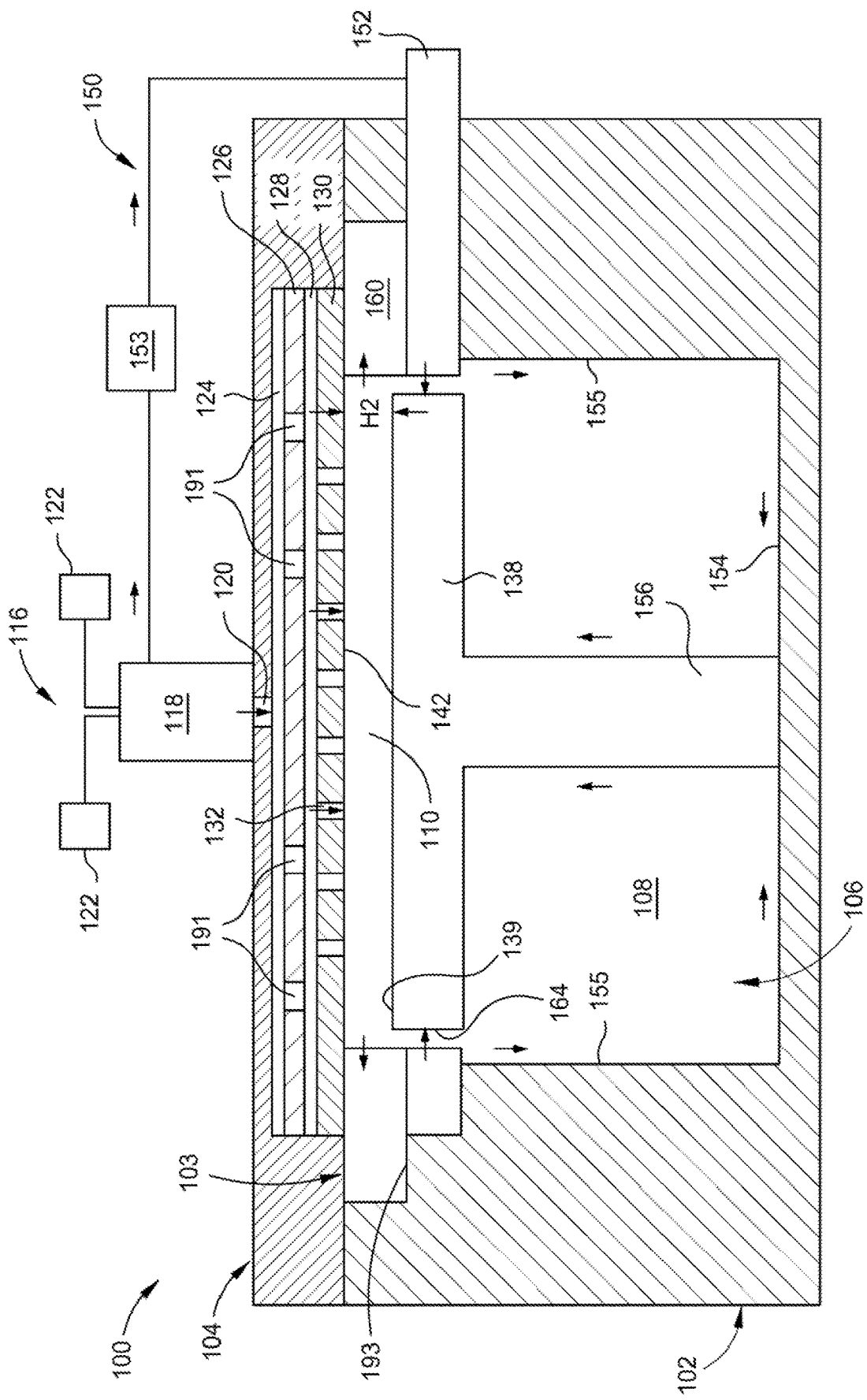

FIG. 2C shows the pedestal 138 in an intermediate position between upper and lower positions with a second vertical spacing, or height H2, of about 0.25 to about 2 inches, such as about 1 inch. With the pedestal 138 in the intermediate position, the isolation valve 153 may remain opened and a portion of the flow of cleaning fluid 188 diverted away from the faceplate 130 to the distribution plate 152. Positioning the pedestal 138 in the intermediate position results in cleaning predominantly of the pedestal edge 164 and may also result in cleaning of the sidewall 155, bottom surface 154 and bottom neck 156.

Figure 2D:
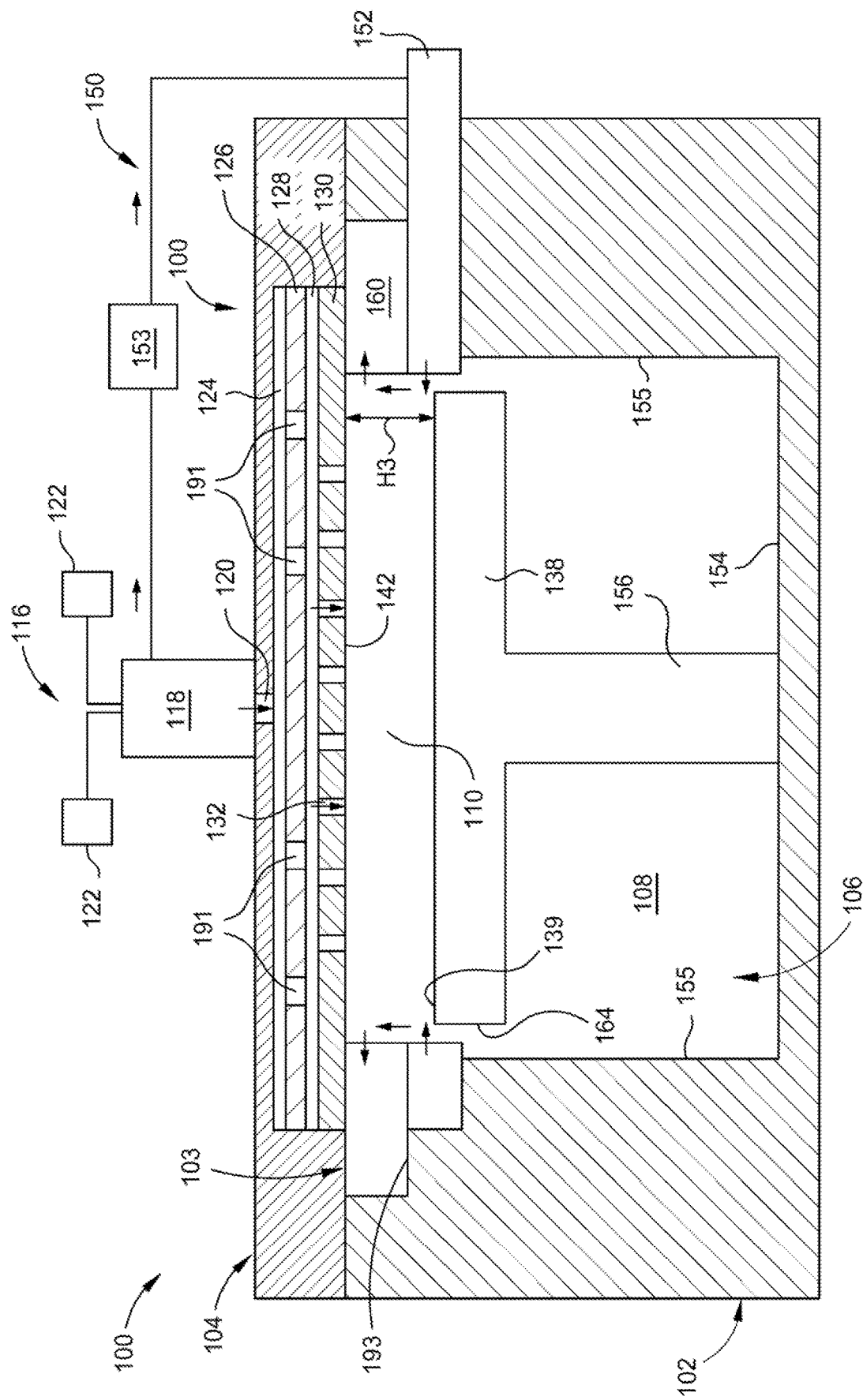

FIG. 2D shows the pedestal 138 in a lower position with a third vertical spacing, or height H3, of about 2 inches or greater, such as about 2 inches to about 2.5 inches, such as about 2.3 inches. With the pedestal 138 in the lower position, the isolation valve 153 may remain opened and a portion of the flow of cleaning fluid 188 diverted away from the faceplate 130 to the distribution plate 152. Positioning the pedestal 138 in the lower position results in cleaning predominantly of a pedestal pocket, which refers at least in part to the pumping ring 160. Although only three vertical positions of the pedestal 138 are shown, the pedestal 138 may be positioned in one or more additional positions to adjust or improve the cleaning process.

Figure 3:
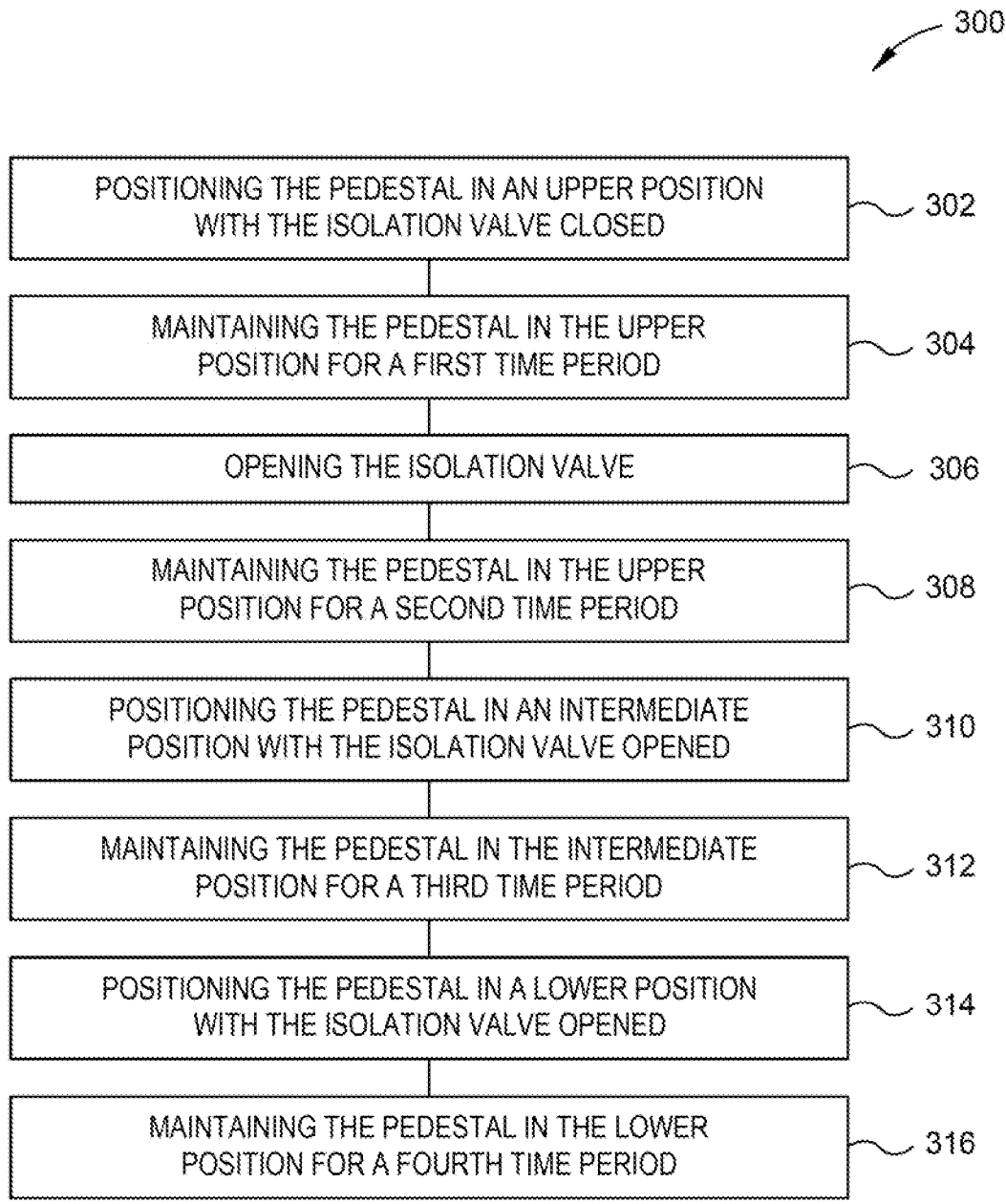
FIG. 3 is a diagram illustrating an exemplary method of cleaning the substrate processing chamber of FIG. 1A described with respect to FIGS. 2A-2D.

In one embodiment, the pedestal 138 is cycled through different vertical positions during cleaning. FIG. 3 is a diagram illustrating an exemplary method 300 of cleaning the substrate processing chamber 100 of FIG. 1A described with respect to FIGS. 2A-2D. At operation 302, the pedestal 138 is positioned in the upper position (shown in FIG. 2A) with the isolation valve 153 closed. At operation 304, the pedestal 138 is maintained in the upper position for a first time period resulting in cleaning predominantly of the faceplate 130. The first time period may be about 10 seconds to about 30 seconds, such as about 20 seconds.

At operation 306, the isolation valve 153 is opened. At operation 308, the pedestal is maintained in the upper position (shown in FIG. 2B) for a second time period resulting in cleaning predominantly of the sidewall 155, bottom surface 154 and bottom neck 156. The second time period may be about 30 seconds to about 90 seconds, such as about 60 seconds.

At operation 310, the pedestal 138 is positioned in the intermediate position (shown in FIG. 2C) with the isolation valve 153 opened. At operation 312, the pedestal 138 is maintained in the intermediate position for a third time period resulting in cleaning predominantly of the pedestal edge 164. The third time period may be about 30 seconds to about 90 seconds, such as about 60 seconds.

At operation 314, with the isolation valved opened 153, the pedestal 138 is positioned in the lower position (shown in FIG. 2D). At operation 316, the pedestal 138 is maintained in the lower position for a fourth time period resulting in cleaning predominantly of the pedestal pocket. The fourth time period may be about 30 seconds to about 90 seconds, such as about 60 seconds. A total cleaning time of the method 300 may be about 200 seconds or less to improve throughput. Further, at least some operations of the method 300 may be carried out sequentially or simultaneously. The operations of the method 300 may also be reordered and/or cycled through more than once with the same or different timing and certain operations may be added or removed in order adjust or improve the cleaning process.

The substrate processing chamber 100 and cleaning assembly 150 may form part of the substrate processing system which further includes a non-transitory computer readable medium storing instructions for a cleaning process, such as the method 300, to be executed by a processor of the system.

Benefits of the present disclosure include improved cleaning of substrate processing chambers, reduced cleaning time and increased throughput due to directly introducing cleaning fluid below the faceplate, such as to the lower portion of the internal volume of the chamber.

It is contemplated that one or more aspects of the cleaning assembly disclosed herein may be combined. Moreover, the one or more aspects of the cleaning assembly may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A cleaning assembly for a substrate processing chamber, the cleaning assembly comprising:
   a gas manifold fluidly coupled to a lid of the substrate processing chamber and a distribution ring located below and adjacent to a pumping ring, the gas manifold configured to provide a first portion of cleaning fluid to a lower portion of an internal volume of the substrate processing chamber through the distribution ring and a second portion of cleaning fluid into a processing region of the internal volume of the substrate processing chamber through the lid,
   the distribution ring comprising:
      a body with an inlet and
      an outlet fluidly coupled to the lower portion of the internal volume of the substrate processing chamber via a sidewall of the substrate processing chamber; and
   a cleaning conduit configured to fluidly couple the gas manifold to the distribution ring.

2. The cleaning assembly of claim 1, further comprising an isolation valve fluidly coupled to the cleaning conduit between the gas manifold and the distribution ring for regulating flow of the first portion of the cleaning fluid to the distribution ring.

3. The cleaning assembly of claim 1, wherein the outlet of the distribution ring comprises one or more openings in the sidewall of the substrate processing chamber for introducing the first portion of the cleaning fluid to the internal volume.

4. The cleaning assembly of claim 3, wherein the distribution ring comprises a baffle disposed between the inlet and the one or more openings for improving uniform distribution of the first portion of the cleaning fluid through the one or more openings.

5. The cleaning assembly of claim 1, wherein the first portion of the cleaning fluid comprises about 40% to about 60% of a total flow of cleaning fluid through the gas manifold.

6. The cleaning assembly of claim 1, wherein the gas manifold is configured for coupling to a remote plasma source.

7. The cleaning assembly of claim 1, wherein the distribution ring further comprises one or more quartz liners.

8. The cleaning assembly of claim 1, wherein the distribution ring is configured to deliver the first portion of the cleaning fluid directly to a portion of the internal volume below a faceplate of the substrate processing chamber to improve cleaning of at least one of a bottom neck, pedestal edge, chamber sidewall, or the pumping ring.

9. The cleaning assembly of claim 1, wherein the gas manifold comprises:
   an inlet configured to fluidly couple to a cleaning fluid source;
   a first outlet fluidly coupled to the internal volume via a lid of the substrate processing chamber; and
   a second outlet fluidly coupled to the cleaning conduit.

10. A substrate processing assembly, comprising:
    a chamber body and a lid defining an internal volume;
    a faceplate disposed in the internal volume; and
    a cleaning assembly, comprising:
       a manifold comprising:
          an inlet configured to fluidly couple to a cleaning fluid source;

a first outlet fluidly coupled to the internal volume above the faceplate through the lid; and
a second outlet; and
a distribution ring located below and adjacent to a pumping ring, the distribution ring having an inlet fluidly coupled to the second outlet of the manifold and an outlet fluidly coupled to the internal volume via one or more openings in a sidewall of the chamber body below the faceplate, wherein the cleaning assembly is configured to introduce a first portion of cleaning fluid to the internal volume below the faceplate through the distribution ring and a second portion of cleaning fluid to the internal volume above the faceplate through the lid.

11. The substrate processing assembly of claim 10, further comprising an isolation valve fluidly coupled between the second outlet of the manifold and the distribution ring, wherein the isolation valve is configured to divert a first portion of cleaning fluid to the internal volume through the distribution ring.

12. The substrate processing assembly of claim 10, further comprising:
a pedestal disposed in the chamber body, wherein
the pumping ring is disposed around the pedestal and comprises an exhaust port fluidly coupled to the internal volume.

13. A substrate processing system, comprising:
a chamber defining an internal volume;
a faceplate disposed in the internal volume;
a pedestal disposed in the chamber;
a cleaning assembly, comprising:
a cleaning fluid source;
a distribution ring located below and adjacent to a pumping ring, the distribution ring having an inlet fluidly coupled to the cleaning fluid source and an outlet fluidly coupled to the internal volume via one or more openings in a sidewall of the chamber; and
an isolation valve fluidly coupled between the cleaning fluid source and the distribution ring; and
a non-transitory computer readable medium storing instructions for a cleaning process, that, when executed by a processor of the system, cause the system to sequentially:
position the pedestal in a first vertical position;
direct cleaning fluid to the internal volume entirely above the faceplate through a lid of the chamber; and
open the isolation valve to divert a first portion of the cleaning fluid to the distribution ring and into the internal volume below the faceplate.

14. The substrate processing system of claim 13, wherein the computer readable medium stores instructions further causing the system to:
position the pedestal in a second vertical position below the first vertical position to improve cleaning of at least one of a bottom neck, pedestal edge, or chamber sidewall.

15. The substrate processing system of claim 14, a wherein the pumping ring is disposed around the pedestal and comprises an exhaust port fluidly coupled to the internal volume.

16. The substrate processing system of claim 15, wherein the computer readable medium stores instructions further causing the system to:
position the pedestal in a third vertical position below the second vertical position to improve cleaning of the pumping ring.

17. The substrate processing system of claim 13, wherein a total time for the cleaning process is about 200 seconds or less.

* * * * *